United States Patent [19]

Blomley

[11] 3,711,781

[45] Jan. 16, 1973

[54] ELECTRICAL AMPLIFIER ARRANGEMENTS

[75] Inventor: Peter F. Blomley, Towcester, England

[73] Assignee: The Plessey Company Limited, Ilford, England

[22] Filed: Nov. 3, 1970

[21] Appl. No.: 86,454

[30] Foreign Application Priority Data

Nov. 4, 1969 Great Britain....................53,916/69

[52] U.S. Cl. ........................330/15, 330/22, 330/40

[51] Int. Cl. ............................................H03f 3/26

[58] Field of Search...........................330/15, 22, 40

[56] References Cited

UNITED STATES PATENTS 3,237,002 2/1966 Patmore ............................330/40 X 3,408,589 10/1968 Nishioka............................330/15 X 2,924,778 2/1960 Barton..................................330/15

3,448,395 6/1969 Webb ................................330/15 X

*Primary Examiner*—John Kominski

*Assistant Examiner*—Lawrence J. Dahl

*Attorney*—Mason, Mason and Albright

[57] ABSTRACT

Two amplifier devices are connected in a push-pull output configuration, and are both biased to a conductive point at the beginning of the linear portion of their transfer characteristics. The input signal to be amplified is applied to the amplifier devices through input means, such asidiodes, which are so poled as to prevent the application of the input signal to either device when the polarity of the input signal, relative to a datum, is such that it would bias that device out of conduction. Thus, the devices amplify alternately but both of them are always conductive, and class B operation is thus achieved in a manner which can substantially overcome the problem of cross-over distortion.

8 Claims, 8 Drawing Figures

INVENTOR
PETER F. BLOMLEY
BY
Mason, Mason & Albright
ATTORNEYS

INVENTOR
PETER F. BLOMLEY

BY
Mason, Mason & Albright
ATTORNEYS

INVENTOR
PETER F. BLOMLEY
BY
Mason, Mason & Albright
ATTORNEYS

INVENTOR
PETER F. BLOMLEY
BY
Mason, Mason & Albright
ATTORNEYS

ELECTRICAL AMPLIFIER ARRANGEMENTS

BACKGROUND OF THE INVENTION

The invention relates to electrical amplifier arrangements, such as for example to power amplifiers of the Class B type using transistors.

In known types of Class B amplifier arrangements, the amplifying device is biased so as to be conductive for only a proportion of each input signal cycle. This arrangement gives high efficiency but the output is zero for the non-conductive portion of each cycle. It is therefore normal to arrange two Class B amplifier devices in a push-pull output configuration so that each amplifier device is conductive alternately to give a continuous output. This arrangement preserves the high efficiency but suffers from the disadvantage that serious discontinuities in the output may occur during the process of transferring the output between one amplifier device and the other. Such discontinuities are due to the inevitable non-linear nature of the transfer characteristics of the amplifier devices: such non-linearities become effective to cause discontinuities at the change over point when one amplifier device begins to go into full conduction while the other is going through the reverse process.

It is an object of the invention to overcome this disadvantage. More particularly, it is an object of the invention to produce an amplifier arrangement in which the advantages (high efficiency and low quiescent current) of Class B operation are preserved without the disadvantages (serious cross-over distortion).

BRIEF SUMMARY OF THE INVENTION

According to the invention, there is provided an electrical amplifier arrangement, comprising two electrical signal amplifier devices, circuit means connecting the amplifier devices in a push-pull configuration, bias circuitry operative to bias both devices into conduction at the same time, and input means connected to control the application of an input signal to the two devices and operative to prevent the application of the input signal to each device when the polarity of the input signal with respect to a datum is such that it would tend to render that device non-conductive.

From the above it will be seen that, in operation, each of the two amplifier devices is always conductive. In effect, each amplifier device operates in the Class A mode and preferably on the linear portion of its characteristics, such that when the outputs of the two amplifier devices are combined, the result is an amplifier arrangement which is operationally similar to and has the same advantages as a Class B amplifier arrangement but with much less susceptibility to cross-over distortion.

The amplifier arrangements embodying the invention may be voltage or current driven.

BRIEF DESCRIPTION OF THE DRAWINGS

Amplifier arrangements embodying the invention will now be described, by way of example only, with reference to the accompanying drawings in which.

Figure 1:
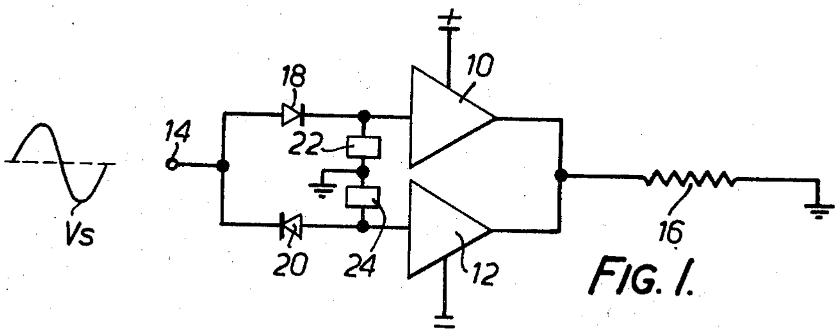
FIG. 1 is a block circuit diagram of one form of the amplifier arrangement embodying the invention.

The amplifier arrangement of FIG. 1 comprises two amplifiers 10, 12, connected in push-pull to receive an input voltage waveform at an input terminal 14 and to produce an output voltage across a load resistor 16. The input terminal 14 is connected to the inputs of the amplifiers 10 and 12 through respective diodes 18, 20.

Figure 2:
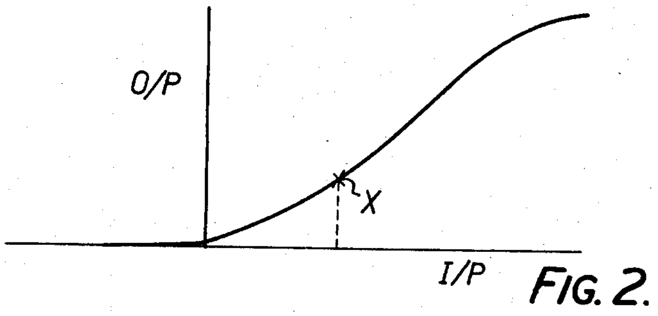
FIG. 2 shows a transfer characteristic of amplifier devices used in the amplifier arrangement of FIG. 1.

FIG. 2 shows the input/output or transfer characteristics of each of the amplifiers 10 and 12 which may for example be transistor amplifiers. Bias sources 22 and 24 (FIG. 1) apply small biases to the input of each of the amplifiers 10 and 12 so as to bias each amplifier to the point X (FIG. 2) on its transfer characteristic; as shown, the point X is positioned at the beginning of the linear portion of the transfer characteristic.

In operation, diode 18 conducts during the positive half-cycle of the input voltage applied to terminal 14, and the input voltage waveform drives the amplifier 10 up the transfer characteristic from the point X and down again to that point. Thus the amplifier 10 produces an output given by A. $(Vb + Vs)$, where A is the gain of the amplifier 10, $Vb$ is the bias voltage applied to the input of the amplifier 10, and $Vs$ is the input voltage. During this half cycle, the diode 20 is cut off, and the amplifier 12 therefore produces an output given by $A.Vb$. Since the two amplifiers are connected in push-pull, the resultant output into the load 16 is given by $A.(Vb + Vs) - A.Vb = A.Vs$. During the next half cycle, diode 18 is cut off, so that the output of amplifier 10 is given by $A.Vb$, while the diode 20 conducts and the output from amplifier 12 is given by $A.(Vb + Vs)$, thus resulting in an output into the load 16 of $A.Vs$.

From the above, it will be seen that neither amplifier is ever cut off: each of the amplifiers is always conducting at least to the extent defined by the point X (FIG. 2), and cross-over distortion, which may be present in amplifier arrangement using two Class B amplifiers in push-pull configuration, is thus eliminated. At the same time, however, the advantages (high efficiency and low quiescent current) of Class B operation is maintained in that the current of the non-effective amplifier (that is, the amplifier whose associated diode 18 or 20 is cut off) is at a very low level defined by the point X (FIG. 2). The amplifier arrangement can therefore combine the advantages of Class B operation without the disadvantages.

Figure 3:
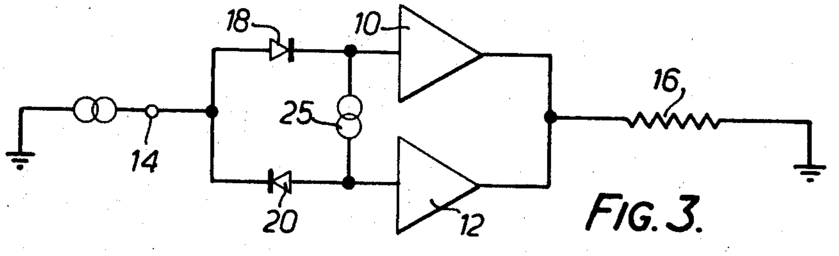
FIG. 3 is a block circuit diagram of another form of amplifier arrangement embodying the invention.

FIG. 3 shows an amplifier arrangement corresponding to that of FIG. 1 but which is current-driven instead of voltage-driven. In the arrangement of FIG. 3, items corresponding to items in FIG. 1 are correspondingly referenced. The input signal at the input terminal 14 is a current, Is, while the voltage bias sources 22 and 24 of FIG. 1 are replaced by a current bias source 25, producing a bias current of $Ib$. If the current gain of each of the amplifiers 10, 12 is G, then, using similar reasoning to that used above in connection with FIG. 1, the output current into the load 16 is given by G.I.*s*. The bias current I*b* is such as to ensure that the non-effective amplifier (the amplifier whose diode is cut off) is always conducting to the extent determined by the point X in FIG. 2.

It will be appreciated that it is the linearity of the signal-splitting system action provided by the diodes 18, 20 which determines the distortion in the final waveform.

Figure 4:
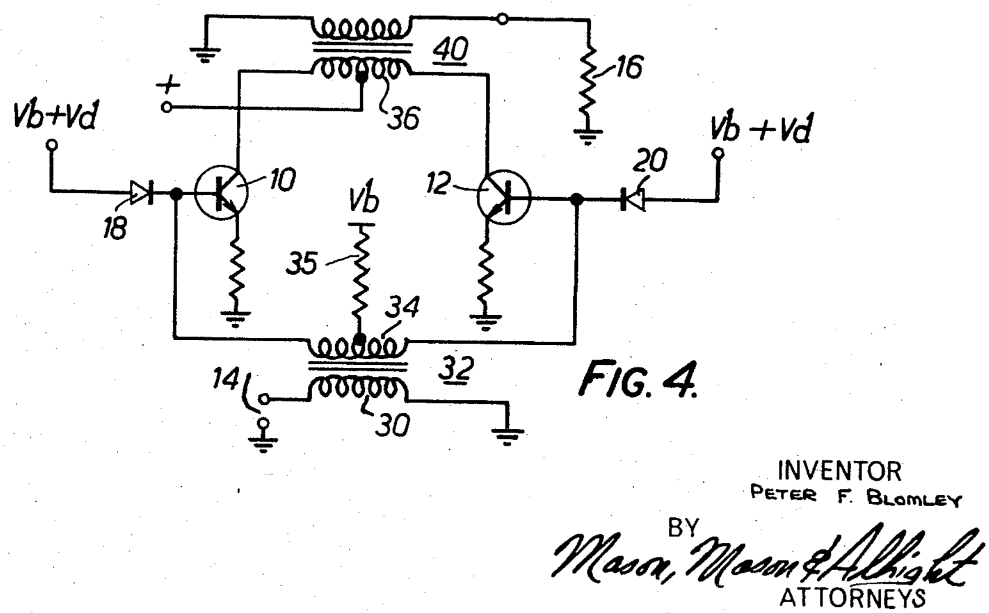
FIG. 4 is a schematic circuit diagram of the form of arrangement shown in FIG. 1.

FIG. 4 shows a schematic diagram of an arrangement corresponding to that of FIG. 1, and items corresponding to those of FIG. 1 are similarly referenced.

In the arrangement of FIG. 4, the input voltage Vs is applied to the primary winding 30 of the transformer 32 having a secondary winding 34 to the center tap of which is applied the bias voltage V*b* through a resistor 35. The amplifiers 10 and 12 comprise respective NPN transistors feeding a primary winding 36 of an output transformer 40 whose secondary winding is connected to the load resistor 16. The ends of the secondary winding 34 of the input transformer are respectively connected to the bases of the transistors 10 and 12. The diodes 18, 20 are also respectively connected to the bases of the transistors 10 and 12. The anodes of the diodes 18, 20 are respectivly supplied with voltages comprising V*b* + V*d*, the voltage V*d* being approximately equal to the volt drop across each diode.

The arrangement of FIG. 4 operates in the manner explained in connection with FIGS. 1 and 2. Thus, during a positive half cycle of the input voltage, the base of transistor 10 is driven positively. The diode 18 is cut off during this process but the resistor 35 applies the bias voltage V*b* to the transistor 10. During this half cycle, diode 20 is held conducting and maintains the base of transistor 12 at the voltage V*b*, thus preventing the transistor from being cut off. During the negative half cycles of the supply, the reverse takes place, that is, diode 18 conducts and diode 20 is held non-conducting.

Figure 5:
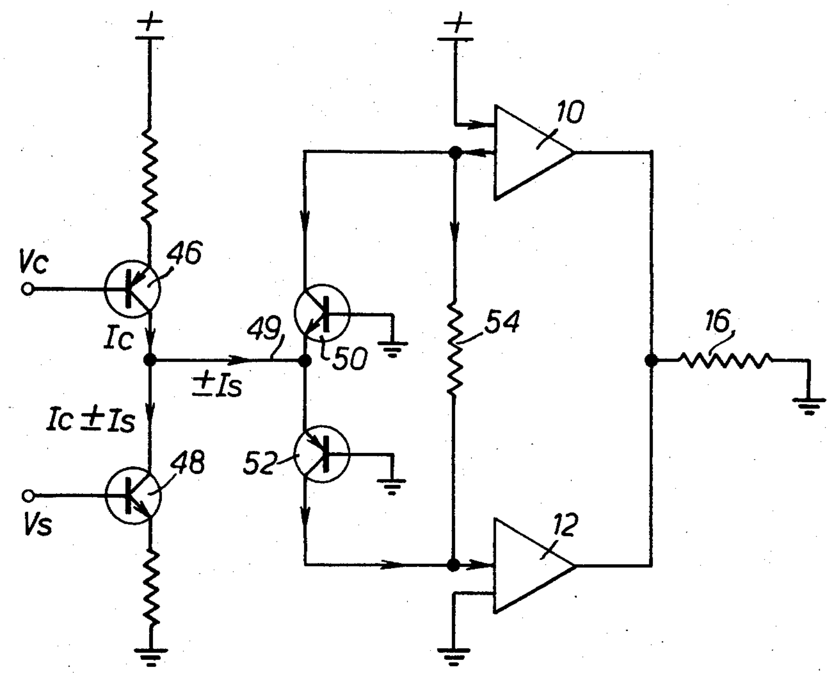
FIG. 5 is a schematic circuit diagram of the form of arrangement shown in FIG. 3.

The arrangement of FIG. 5 corresponds with that of FIG. 3, and corresponding items are similarly referenced.

In FIG. 5, an input circuit is provided for converting the input voltage V*s* into a corresponding current, I*s*. The input circuit comprises two transistors 46, 48 connected back-to-back. A steady voltage V*c* is applied to the base of transistor 46 and establishes a steady current I*c* through the emitter-collector paths of both transistors 46, 48. The signal voltage V*s* is applied to the base of transistor 48 and produces a corresponding current Is in the emitter-collector circuit of transistor 48. The total current, therefore, in the emitter-collector path of transistor 48 is given by I*c* ± I*s*, causing a resultant current ± I*s* to appear on a line 49.

The diodes 18, 20 are replaced by respective transistors 50, 52 whose emitter-base junctions provide the diode action. The collectors of the transistors are respectively connected to the inputs of the amplifiers 10, 12, and a resistor 54, connected between the inputs of the two amplifiers, causes the power supply to the amplifiers to drive the bias current I*b* through the amplifiers.

The arrangement of FIG. 5 operates in the manner explained in connection with FIG. 3. Transistor 50 is cut off during positive half cycles of the current I*s* while transistor 52 is cut off during the negative half cycles. The transistors 50 and 52 provide a level-changing function in addition to the diode function.

Figure 6:
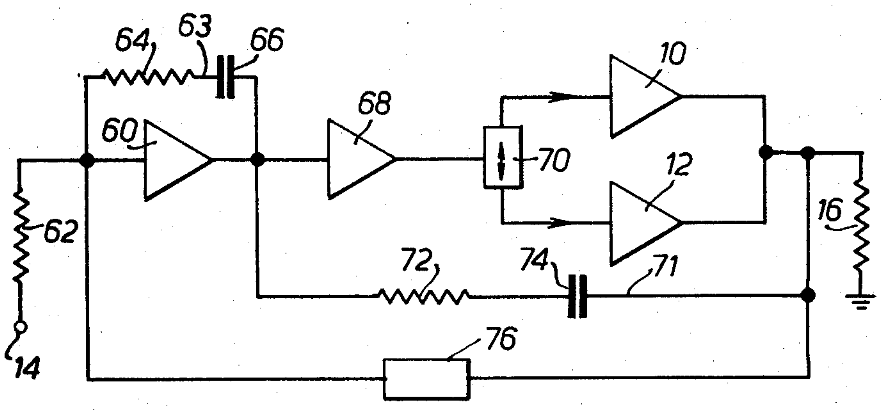
FIG. 6 is a block circuit diagram of yet another form of amplifier arrangement embodying the invention.

FIG. 6 shows a block diagram of a development of the arrangement of FIG. 5 in which provision is made for stabilization. In the arrangement of FIG. 6, the input voltage V*s* to be amplified is applied to a voltage-to-current amplifier 60 through an input resistor 62. A feedback loop 63 comprising a resistor 64 and a capacitor 66 stabilizes the input amplifier 60 and removes transient lags. The output from the amplifier 60 is then amplified in a virtual earth current amplifier 68 and applied to the splitting devices 70 which may comprise diodes or transistors.

The outputs from the splitter 70 are then applied to the amplifiers 10 and 12, which are current amplifiers and feed the load resistor 16. A further feedback path 71 comprising a resistor 72 and a capacitor 74 is connected from the output of the amplifiers 10 and 12 to the input of the virtual amplifiers 68, and an overall feedback path 76 is connected from the load 16 back to the input resistor 62.

Figure 7:
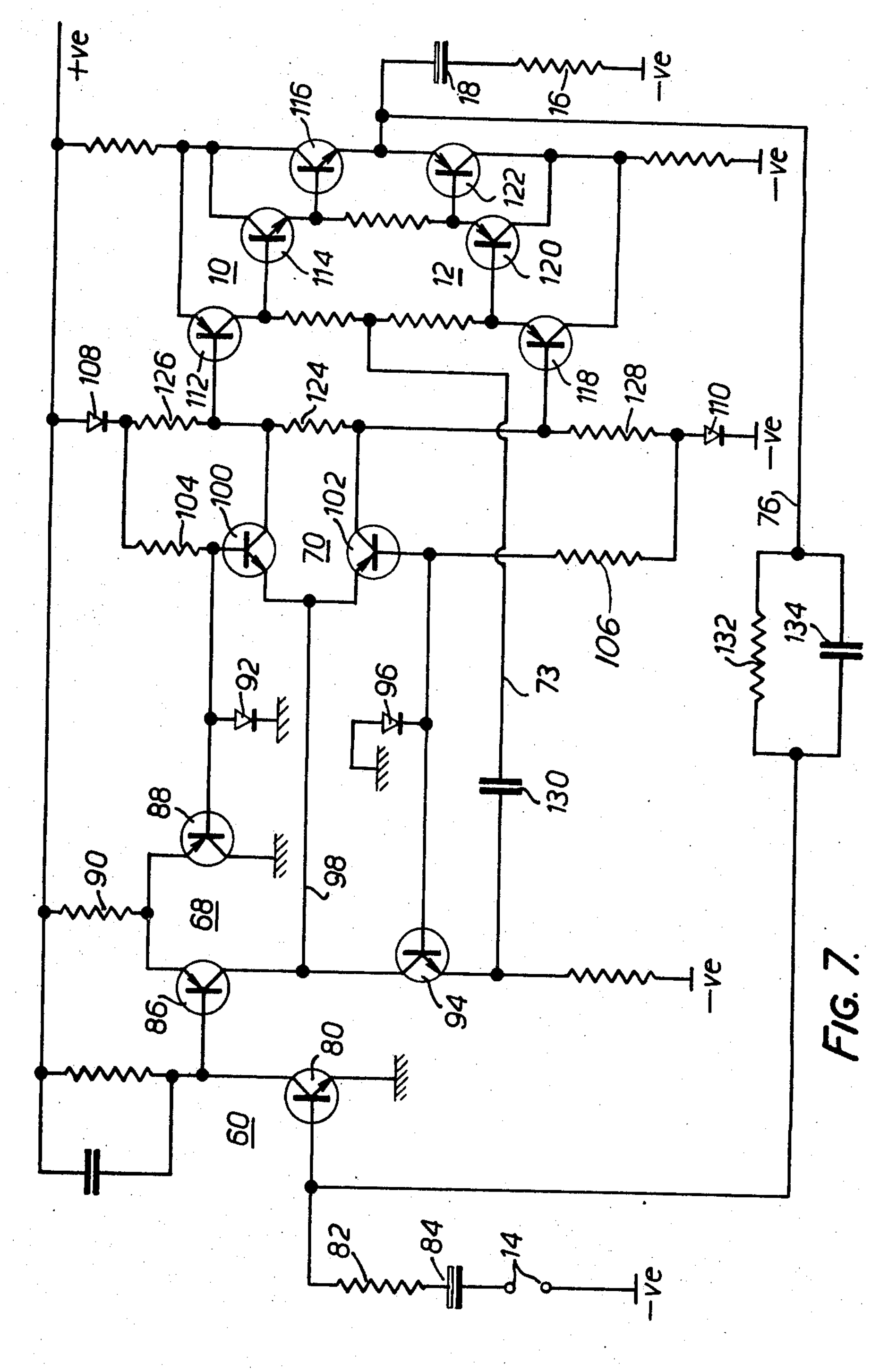
FIGS. 7 and 8 are schematic circuit diagrams of different examples of the amplifier arrangement of FIG. 6.

FIG. 7 is a schematic circuit diagram of an arrangement similar to that shown in FIG. 6 and will now be briefly described.

The input signal V*s* is applied to the base of a transistor 80, constituting the input amplifier 60, through an input resistor 82 and a capacitor 84. The resultant amplified current Is is then amplified in the virtual earth current amplifier 68 comprising two transistors 86, 88, having a common emitter resistor 90. The base of the transistor 88 is connected to earth through a silicon diode 92 which offsets the voltage drop in the transistor. The emitter-collector path of the transistor 86 is connected in series with the emitter-collector path of a further transistor 94, whose base is connected to earth through a germanium diode 96. The latter offsets the voltage drop in the transistor 94 and stabilizes the voltage through the transistor. The amplified signal current thus appears on a line 98 and is fed to the splitters which comprise two transistors 100, 102 whose bases are respectively connected to earth through the diodes 92 and 96. In addition, the bases of the transistors 100 and 102 are biassed through resistors 104, 106, and silicon diodes 108, 110.

The collectors of the transistors 100 and 102 are respectively connected to the amplifiers 10 and 12. Amplifier 10 comprises an amplifying transistor 112 followed by two emitter-follower connected transistors 114 and 116, while amplifier 12 comprises an amplifying transistor 118, and two emitter-follower connected transistors 120 and 122. As shown the amplifiers 10 and 12 are connected in push-pull, and the commoned emitters of transistors 116 and 112 feed the load resistor 16 through a capacitor 18.

A resistor 124, which is fed through the diodes 108 and 110, and resistors 126 and 128, supplies the bias current Ib for the amplifiers 10 and 12. In the manner explained in connection with FIG. 5, transistor 100 is cut off in each alternate half cycle by the amplified signal current on line 98, while transistor 102 is cut off during the intervening half cycles, and the amplifiers 10 and 12 operate in push-pull to produce the output current in the load 16. The bias current I*b* fixes the minimum operating point X on the transfer characteristic (see FIG. 2) of each amplifier, and both amplifiers therefore operate in Class A in the manner explained.

Stabilization is provided by the feedback loop 73, constituted by a capacitor 130, and by the overall feedback loop 76 constituted by a resistor 132 in parallel with a capacitor 134.

Figure 8:
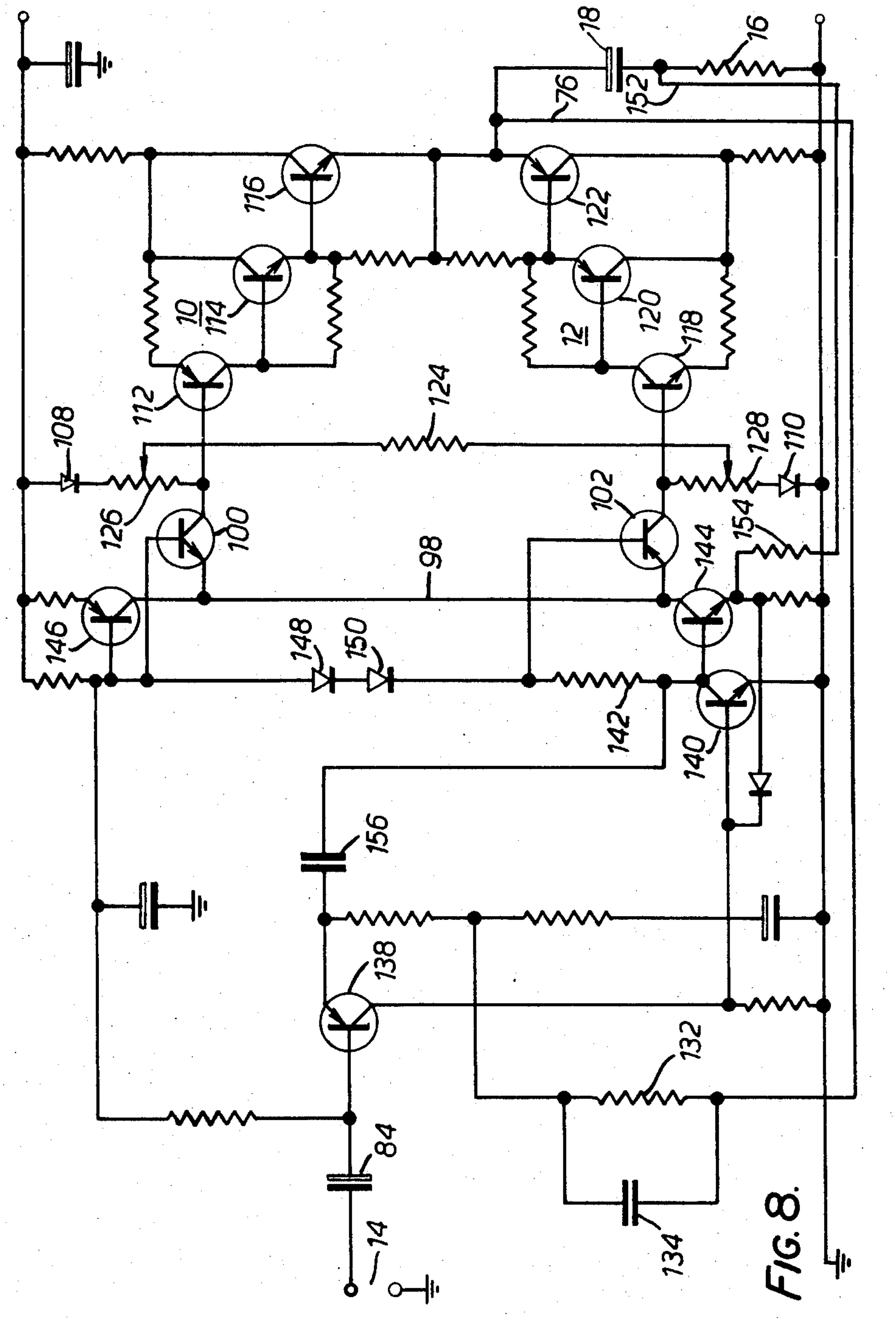

FIG. 8 shows a schematic circuit diagram of another arrangement similar to that shown in FIG. 6, and parts in FIG. 8 corresponding to parts in FIGS. 6 and 7 are similarly referenced.

The arrangement of FIG. 8 differs from that of FIG. 7 in that the input signal $V_s$ is applied to the base of an amplifying transistor 138 and thence to the base of a further amplifying transistor 140. The transistor 140 produces an amplified current proportional to the input signal $V_s$ and this current, flowing through a resistor 142, produces a voltage which is applied to a transistor 144, connected in emitter-follower configuration. The collector current of transistor 144 is therefore proportional to the input signal $V_s$. The current is compared with the fixed collector current in a transistor 146 and the difference current is fed through either transistor 100 or transistor 102 according to its polarity, in the manner explained in connection with FIG. 7, and thence to amplifier 10 or 12.

Diodes 148 and 150 bias the transistors 100 and 102 just below the point of conduction.

The arrangement of FIG. 8 has three feedback loops. A first feedback loop is taken from the commoned output of the amplifiers 10 and 12 by line 76, and applied through resistor 132 and capacitor 134 to the transistor 138. A second feedback loop is provided by a line 152 which is connected from the load 16 to the emitter of transistor 144 via a resistor 154. Finally, a capacitor 156 connects the collector of transistor 140 and the emitter of transistor 138.

What is claimed is:

1. An electrical amplifier arrangement comprising two electrical signal amplifier devices,
circuit means connecting the amplifier devices in a push-pull configuration,
bias circuitry continuously connected to both amplifier devices and biasing them both substantially equally into conduction at the same time, and
input means connected to control the application of an input signal to the two amplifier devices, the input means including respective rectifying means for the two amplifier devices, each said rectifying means having a connection to the input of its respective amplifier device with the biasing circuitry connecting into each such connection and to a reference potential, the input signal being applied to the devices under control of the rectifying means, the two rectifying means being so poled as to block the application of the input signal to each amplifier device when the polarity of the input signal with respect to a datum is such that it would tend to overcome the effect of the bias circuitry and to render that device non-conductive.

2. An arrangement according to claim 1, in which the bias supplied by the bias circuitry is such as to bias each amplifier device into conduction at an initial point on a linear portion of its transfer characteristic.

3. An arrangement according to claim 1, in which the rectifying means comprises diodes respectively connected to the inputs of the two devices and poled so that one diode conducts during alternate half cycles of the input signal and the other diode conducts during the intervening half cycles.

4. An arrangement according to claim 1, in which the rectifying means comprises two transistors respectively connected to the inputs of the amplifier devices whereby one transistor conducts during alternate half cycles of the input signal and the other transistor conducts during the intervening half cycles.

5. An arrangement according to claim 1, in which the amplifier devices comprise respective transistor circuits.

6. An arrangement according to claim 1, in which:
the amplifier devices comprise respective transistors whose collectors are connected together to provide the push-pull output,
the input means includes a transformer having primary and secondary windings with the secondary winding connected between the bases of the two transistors and the primary winding connected to receive the input signal,
the bias means comprises a source of predetermined voltage, a tapping on the said secondary winding, and means connecting the source between, on the one hand, the emitter of the two transistors and, on the other hand, the said tapping whereby a predetermined bias voltage is applied between the base and emitter of each said transistor, and
the rectifying means comprises respective diode means connected to the base of each of the said transistors through which a voltage equal to the said predetermined bias voltage can be applied between the base and emitter of each transistor, such that each diode means is cut off when the input signal applied to the transistor base connected to that diode means exceeds the predetermined bias voltage applied to that base but conducts when the input signal applied to that base is less than the predetermined bias voltage.

7. An arrangement according to claim 1, in which:
the amplifier devices comprise respective transistors whose collectors are connected together to provide the push-pull output,
the input means comprises an input transistor operative, when its base is energized by the input signal, to produce an input current proportional to the input signal, and the rectifying means comprises a pair of diode means both connected to receive the input current and respectively connected to feed the input current to the bases of the two amplifying transistors and so poled that one diode means conducts when the input current has one polarity and the other diode means conducts when the input current has the other polarity, and
the bias means comprises impedance means connecting the bases of the two amplifying transistors whereby to provide a conduction path for a predetermined bias current passing through the base-emitter junctions of the two amplifying transistors.

8. An arrangement according to claim 7, in which the diode means comprise respective transistors.

* * * * *